United States Patent
Suemitsu et al.

[11] Patent Number: 6,144,048
[45] Date of Patent: Nov. 7, 2000

[54] HETEROJUNCTION FIELD EFFECT TRANSISTOR AND METHOD OF FABRICATING THE SAME

[75] Inventors: Tetsuya Suemitsu; Takatomo Enoki, both of Kanagawa, Japan

[73] Assignee: Nippon Telegraph and Telephone Corporation, Japan

[21] Appl. No.: 09/471,524

[22] Filed: Dec. 23, 1999

Related U.S. Application Data

[63] Continuation of application No. 09/006,284, Jan. 13, 1998, abandoned.

[51] Int. Cl.$^7$ .................................................. H01L 31/072
[52] U.S. Cl. .......................... 257/192; 257/194; 257/284
[58] Field of Search .................................. 257/192, 194, 257/280, 281, 282, 283, 284

[56] References Cited

U.S. PATENT DOCUMENTS

| | | | |
|---|---|---|---|
| 5,043,777 | 8/1991 | Sriram | 257/194 |
| 5,391,899 | 2/1995 | Kohno | 257/192 |
| 5,508,535 | 4/1996 | Nakanishi | 257/194 |
| 5,663,583 | 9/1997 | Matloubian et al. | 257/192 |
| 5,686,740 | 11/1997 | Hida | 257/194 |
| 5,739,557 | 4/1998 | O'Neil, II et al. | 257/194 |
| 5,739,558 | 4/1998 | Ishida et al. | 257/192 |
| 5,811,844 | 9/1998 | Kuo et al. | 257/192 |

FOREIGN PATENT DOCUMENTS

| | | | |
|---|---|---|---|
| 0367411 | 5/1989 | European Pat. Off. | H01L 29/812 |
| 0601541 | 7/1993 | European Pat. Off. | H01L 29/812 |
| 6-120258 | 4/1994 | Japan . | |
| 6-168962 | 6/1994 | Japan . | |
| 6-302625 | 10/1994 | Japan . | |
| 6-333955 | 12/1994 | Japan . | |
| 7-193224 | 7/1995 | Japan . | |
| 7-273317 | 10/1995 | Japan . | |

OTHER PUBLICATIONS

A Recessed–Gate InAlAs/n + –InP HFET with an InP Etch–Stop Layer, Greenberg et al., IEEE Electron Device Letters, vol. 13, No. 3, pp. 137–139, Mar. 1992.

Patent Abstracts of Japan, vol. 018, No. 403, Jul. 27, 1994, p. 328.

Adeside I et al., Reactive Ion Etching Of Submicrometer Structes In Inp, Sep. 11–14, 1988, No. Symp 15, Sep. 11, 1988, pp. 425–430.

Enoki T et al., Topical Workshop on Heterostructure Microelectronics, Aug. 18–21, 1996, vol. 41, No. 10, pp. 1651–1656.

*Primary Examiner*—Sara Crane
*Attorney, Agent, or Firm*—Blakely Sokoloff Taylor & Zafman

[57] ABSTRACT

A Schottky barrier layer in separate regions between a source electrode and a gate electrode and between a drain electrode and the gate electrode is completely covered with an etching stopper layer. The gate electrode is separated from a cap layer.

6 Claims, 8 Drawing Sheets

HETEROJUNCTION FIELD EFFECT TRANSISTOR AND METHOD OF FABRICATING THE SAME

This application is a continuation of Ser. No. 09/006,284, filed Jan. 13, 1998, abandoned.

BACKGROUND OF THE INVENTION

The present invention relates to a heterojunction field effect transistor and a method of fabricating the same.

A heterojunction field effect transistor (HFET) is also called, e.g., a high electron mobility transistor (HEMT) or a modulation dope field effect transistor (MODEFET) and developed as an ultra-high-speed electronic device or a milliwave-microwave electronic device.

A typical example of this heterojunction field effect transistor uses InP as a semiconductor substrate, InGaAs as a channel layer, and InAlAs as a barrier layer. This InAlAs-InGaAs HEMT has excellent high-frequency characteristics resulting from high electron mobility obtained by InGaAs and high electron density obtained by a large conduction band energy difference between InAlAs and InGaAs.

FIG. 6 shows a typical structure of a conventional heterojunction field effect transistor. Referring to FIG. 6, a 200-nm $In_{0.52}Al_{0.48}As$ buffer layer 4-1, a 15-nm $In_{0.53}Ga_{0.47}As$ channel layer 4-2, a 3-nm $In_{0.52}Al_{0.48}As$ spacer layer 4-3, a 5-nm $In_{0.52}Al_{0.48}As$ carrier supply layer 4-4 doped with $1\times10^{19}$ cm$^{-3}$ of Si as a dopant, a 10-nm $In_{0.52}Al_{0.48}As$ Schottky barrier layer 4-5, and a 15-nm $In_{0.53}Ga_{0.47}As$ cap layer 4-7 doped with $1\times10^{19}$ cm$^{-3}$ of Si as a dopant are formed in this order on an InP semiconductor substrate 4-0 by a well-known epitaxial growth technique.

Additionally, source and drain regions, e.g., ohmic contact regions of source and drain electrodes 4-8 and 4-9 made from AuGe/Ni or the like are formed on the cap layer 4-7 to oppose each other with a recess OA between them. These source and drain electrodes 4-8 and 4-9 are electrically connected to a two-dimensional electron gas in the channel layer 4-2 via the Schottky barrier layer 4-5, the carrier supply layer 4-4, and the spacer layer 4-3.

The recess OA is formed to separate the source and drain regions. This recess OA is obtained by etching the cap layer 4-7 which is present between the source and drain electrodes 4-8 and 4-9 and is a heavily doped layer. The recess OA is formed by wet-chemical etching using an acid or alkaline solution. When the cap layer 4-7 is removed by this wet-chemical etching, the Schottky barrier layer 4-5 is exposed to form a gate region. Ti/Pt/Au metals are sequentially deposited on the surface of the exposed Schottky barrier layer 4-5 to form a gate electrode 4-10. Regions 4-11 between the source and gate electrodes 4-8 and 4-10 and between the drain and gate electrodes 4-9 and 4-10 are separate regions for separating the source and drain regions.

The properties of the heterojunction field effect transistor shown in FIG. 6 will be described below.

This heterojunction field effect transistor changes the density of the two-dimensional electron gas in the channel layer 4-3 positioned below the gate electrode 4-10 by the voltage applied to the gate electrode 4-10, thereby controlling the current flowing between the source and drain electrodes 4-8 and 4-9.

An important factor by which the performance of this heterojunction field effect transistor is determined is the parasitic resistance in the regions (i.e., the separate regions 4-11) formed between the cap layer 4-7 and the gate electrode 4-10 when the recess OA is formed.

In these separate regions 4-11, the cap layer 4-7 is removed, and the surface of the Schottky barrier layer 4-6 is exposed to form a high surface state. Accordingly, of carrier electrons supplied from the carrier supply layer 4-4, the ratio of electrons decreased by a surface depletion layer becomes higher than in other regions, and the two-dimensional electron gas density in the channel layer 4-3 becomes lower than in other regions. Consequently, the parasitic resistance increases to deteriorate the transistor performance such as the transconductance or the cutoff frequency.

To improve the performance of the heterojunction field effect transistor, therefore, it is necessary to decrease the size of the separate regions 4-11.

On the other hand, the breakdown voltage of a transistor is determined by the reverse breakdown voltage between the gate and drain. That is, when the separate regions 4-11 are small, the voltage applied between the gate and drain is concentrated in these narrow separate regions 4-11, and this significantly decreases the breakdown voltage.

Accordingly, to increase the breakdown voltage of the heterojunction field effect transistor, it is necessary to increase the size of the separate regions 4-11.

As described above, the conditions by which the performance and the breakdown voltage of the heterojunction field effect transistor are improved are contradictory to each other. No conventional methods can satisfy these Fonditions at the same time.

Also, the two-dimensional electron gas density in the carrier layer immediately below the separate regions 4-11 cannot be externally controlled by, e.g., the voltage applied to the gate electrode 4-10 or other electrodes. Therefore, care must be taken in designing the epitaxial layer structure so that the two-dimensional electron gas density in the separate regions 4-11 is well maintained.

From the foregoing, it is difficult to fabricate a heterojunction field effect transistor having a threshold voltage at which the channel is pinched off with no bias applied. In other words, in a heterojunction field effect transistor using electrons as carriers, it is difficult to fabricate a heterojunction field effect transistor whose threshold voltage has a positive value (i.e., an enhancement mode HEMT) or a heterojunction field effect transistor whose threshold voltage has a negative value close to 0 V.

FIGS. 7A and 7B are views for explaining a conventional method by which the above difficulty is eliminated. Referring to FIGS. 7A and 7B, the epitaxial layer structure is so designed as to have a sufficiently large negative threshold value when the cap layer 4-7 is removed. The cap layer 4-7 is removed by wet-chemical etching using an acid or alkaline solution to form the recess OA. Thereafter, Pt/Ti/Pt/Au metals are sequentially arranged as the gate electrode 4-10 on the surface of the Schottky barrier layer 4-5. FIG. 7A shows this state.

Additionally, the wafer is annealed at 250° C. to diffuse Pt of the gate electrode into the Schottky barrier layer 4-5. Consequently, as shown in FIG. 7B, the effective thickness of the Schottky barrier layer 4-5 is decreased only in a portion immediately below the gate. This allows the separate regions 4-11 to hold sufficiently high two-dimensional electron gas density.

In this method, however, the controllability of Pt diffusion by anneal is poor, so the threshold value of each device is difficult to control. Accordingly, the in-plane uniformity of each device on the wafer cannot be ensured.

As a method of assuring the in-plane uniformity, Japanese Patent Laid-Open No. 6-120258 has disclosed a method which uses an etching stopper layer to decrease the effective barrier layer thickness in a region immediately below the gate with high reproducibility. That is, this method exposes the gate electrode formation surface with high reproducibility by using different etching solutions having high selectivity to two layers sandwiching the etching stopper layer.

Since, however, selective wet-chemical etching is used to remove the etching stopper layer, the section of the recess in the etching stopper layer is extended by side-etching. Consequently, the Schottky barrier layer is exposed around the gate electrode, and this undesirably increases the parasitic resistance.

As described above, when a metal (Pt) of the gate electrode is diffused by anneal in the conventional method, the threshold voltage of each device is difficult to control because the controllability of Pt diffusion is poor.

Additionally, when the etching stopper layer is used, wet-chemical etching is used to remove the etching stopper layer. This extends a region where the Schottky barrier layer is exposed around the gate electrode, undesirably increasing the parasitic resistance.

SUMMARY OF THE INVENTION

It is an object of the present invention to provide a heterojunction field effect transistor which improves the characteristics and the breakdown voltage at the same time, and a method of fabricating the same.

To achieve the above object, according to an aspect of the present invention, there is provided a heterojunction field effect transistor comprising a buffer layer arranged on a semiconductor substrate, a channel layer arranged on the buffer layer, a spacer layer arranged on the channel layer, a carrier supply layer arranged on the spacer layer, a Schottky barrier layer arranged on the carrier supply layer, an etching stopper layer arranged on the Schottky barrier layer, a cap layer arranged on the etching stopper layer and containing a high-concentration dopant, a source electrode and a drain electrode arranged apart from each other on the cap layer, a recess formed in a region of the cap layer sandwiched between the source and drain electrodes so as to extend from the cap layer to the Schottky barrier layer via the etching stopper layer, and a gate electrode formed on a surface of the Schottky barrier layer exposed in the recess, wherein portions of the Schottky barrier layer in a separate region between the source electrode and the gate electrode and in a separate region between the drain electrode and the gate electrode are covered with the etching stopper layer, and the gate electrode is separated from the cap layer.

According to another aspect of the present invention, there is provided a method of fabricating a heterojunction field effect transistor, comprising the steps of forming a buffer layer on a semiconductor substrate, forming a channel layer on the buffer layer, forming a spacer layer on the channel layer, forming a carrier supply layer on the spacer layer, forming a Schottky barrier layer on the carrier supply layer, forming an etching stopper layer on the Schottky barrier layer, forming a cap layer containing a high-concentration dopant on the etching stopper layer, forming a source electrode and a drain electrode apart from each other on the cap layer, forming a recess in a separate region sandwiched between the source and drain electrodes of the cap layer by removing the cap layer by etching and forming a recess in the etching stopper layer exposed by removal of the cap layer, thereby exposing the Schottky barrier layer below the etching stopper layer, and forming a gate electrode on a surface of the Schottky barrier layer exposed in the recess.

DESCRIPTION OF THE PREFERRED EMBODIMENTS

Embodiments of the present invention will be described below.

Figure 1:
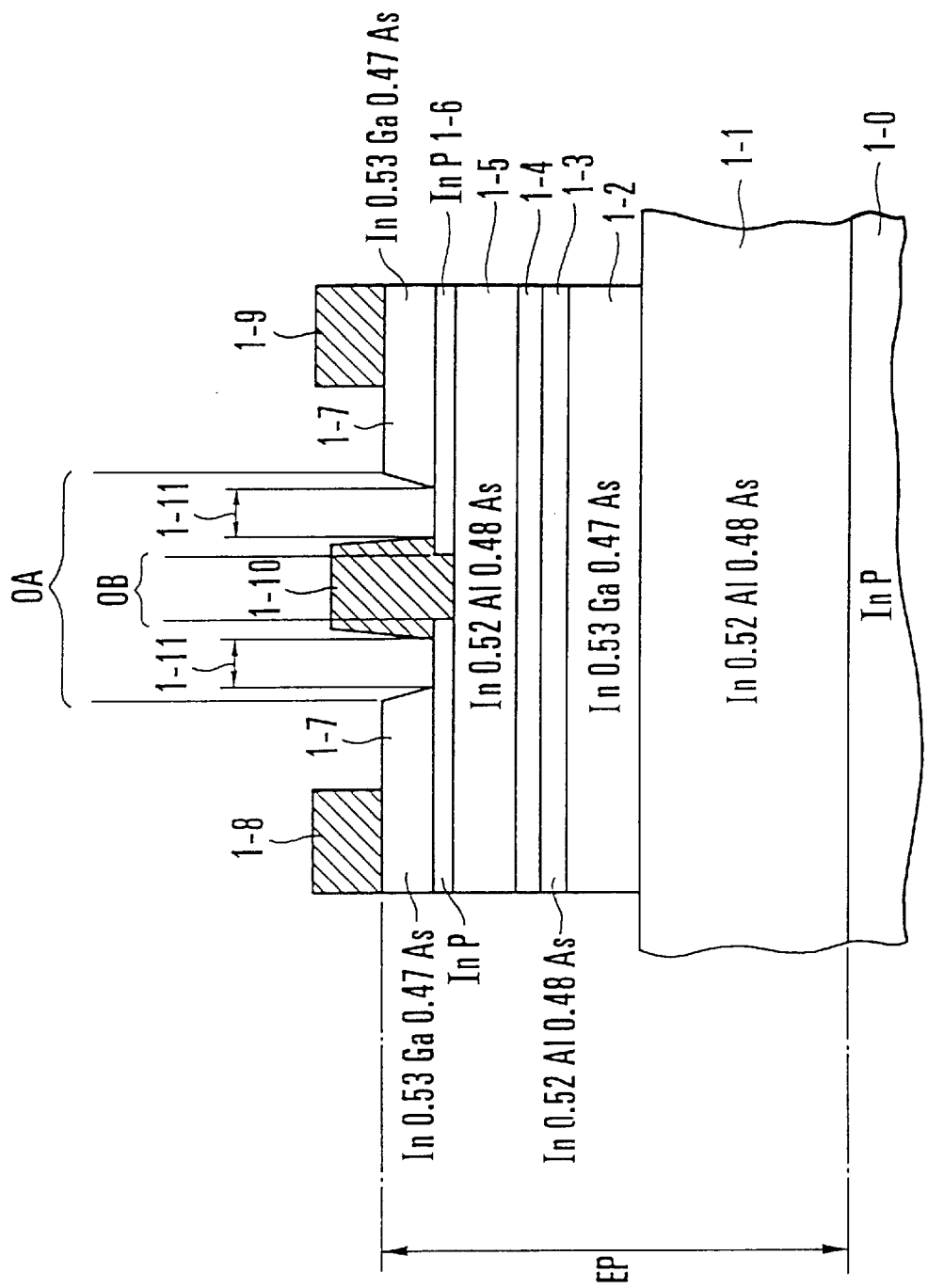
FIG. 1 is a sectional view showing an embodiment of a heterojunction field effect transistor according to the present invention.

FIG. 1 shows one embodiment of a heterojunction field effect transistor according to the present invention. Referring to FIG. 1, an $In_{0.52}Al_{0.48}As$ buffer layer 1-1, an $In_{0.53}Ga_{0.47}As$ channel layer 1-2, an $In_{0.52}Al_{0.48}As$ spacer layer 1-3; a carrier supply layer 1-4 formed by an Si planner doping surface with a surface density of $5 \times 10^{12}$ cm$^{-2}$, an $In_{0.52}Al_{0.48}As$ Schottky barrier layer 1-5, an InP etching stopper layer 1-6, and a 15-nm $In_{0.53}Ga_{0.47}As$ cap layer 1-7 doped with $1 \times 10^{19}$ cm$^{-3}$ of Si as a dopant are formed in this order on an InP semiconductor substrate 1-0 by epitaxial growth (e.g., MOCVD (MetalOrganic Chemical Vapor Deposition) or MBE (Molecular Beam Epitaxy)), thereby forming a multilevel structure.

In this embodiment, the thicknesses of the buffer layer 1-1, the channel layer 1-2, the spacer layer 1-3, the carrier supply layer 1-4, the Schottky barrier layer 1-5, the etching stopper layer 1-6, and the cap layer 1-7 are 200 nm, 15 nm, 3 nm, 5 nm, 10 nm, 6 nm, and 15 nm, respectively.

In fabricating a heterojunction field effect transistor having a threshold voltage of −0.5 V, the transistor is so designed that the threshold voltage is −1.0 V when epitaxial layers above the etching stopper layer 1-6 are removed and −0.5 V when epitaxial layers above the Schottky barrier layer 1-5 are removed. When the transistor is thus designed, the two-dimensional electron gas density in the channel layer 1-2 immediately below separate regions 1-11 can be maintained at a high density. Consequently, the parasitic resistance lowers, and this improves the FET characteristics such as the transconductance and the cutoff frequency.

That is, in a FET using electrons as carriers, a negative threshold voltage indicates that it is necessary to apply a negative bias to the gate electrode in order to pinch off the channel. In contrast, a positive threshold voltage means that the channel is pinched off with no bias applied and it is necessary to apply a positive bias to the gate electrode in order to supply a current between the source and drain. Also, with no bias applied, the carrier electron density immediately below the gate electrode increases as the threshold voltage increases in a negative direction and is zero when the threshold voltage is positive.

A high-threshold-voltage type heterojunction field effect transistor or an enhancement mode heterojunction field effect transistor can also be fabricated by a similar method. For example, the transistor is so designed that the threshold voltage is −0.5 V when epitaxial layers above the etching stopper layer 1-6 are removed and +0.1 V when epitaxial layers above the Schottky barrier layer 1-5 are removed. This transistor can be expected to operate as an enhancement mode heterojunction field effect transistor.

On the surface of the epitaxial layer (cap layer 1-7) fabricated as above, ohmic contact regions of a source electrode 1-8 and a drain electrode 1-9 made from, e.g., AuGe/Ni are formed and electrically connected to a two-dimensional electron gas formed in the channel layer 1-2. A gate electrode 2-10 is formed by forming a recess OA by removing the cap layer 1-7 by isotropic wet-chemical etching, recessing the etching stopper layer 1-6 by anisotropic dry etching, and sequentially depositing Ti/Pt/Au metals on the exposed Schottky barrier layer 1-5.

With the arrangement characterized by the present invention as described above, etching in the direction of depth is prevented by the etching stopper layer 1-6. Therefore, the side-etched regions (separate regions 1-11) of the cap layer 1-7 are extended by prolonging the wet-chemical etching time, and this improves the breakdown voltage. Also, in this structure the separate regions 1-11 are covered with at least the etching stopper layer 1-6, so high two-dimensional electron gas density can be maintained. Accordingly, deterioration of the characteristics caused by the parasitic resistance can be suppressed compared to conventional structures.

A method of fabricating the-heterojunction field effect transistor shown in FIG. 1 will be described in detail below with reference to FIGS. 2A to 2F.

Figure 2A:
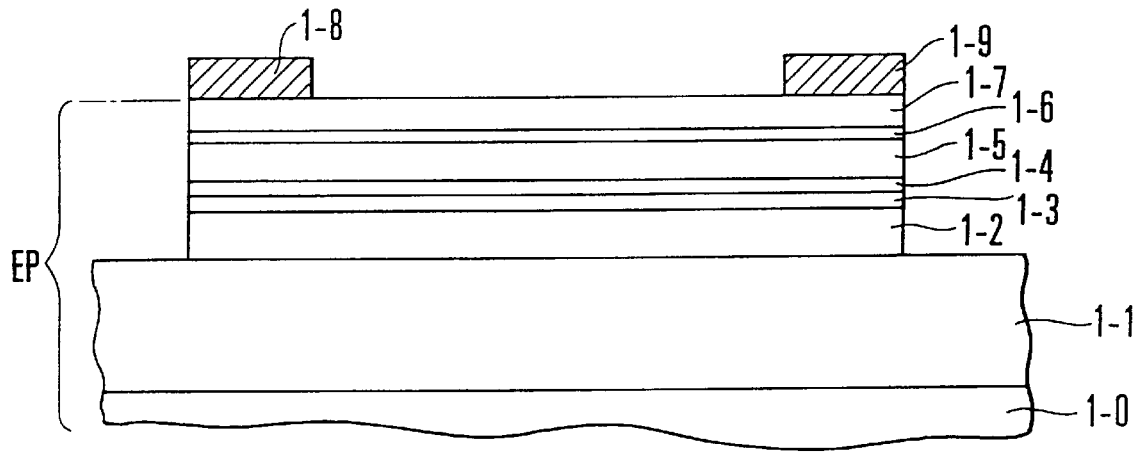
FIGS. 2A to 2F are sectional views showing a method of fabricating the heterojunction field effect transistor shown in FIG. 1.

Referring to FIG. 2A, a 200-nm $In_{0.52}Al_{0.48}As$ buffer layer 1-1, a 15-nm $In_{0.53}Ga_{0.47}As$ channel layer 1-2, a 3-nm $In_{0.52}Al_{0.48}As$ spacer layer 1-3, a 5-nm carrier supply layer 1-4, a 10-nm $In_{0.52}Al_{0.48}As$ Schottky barrier layer 1-5, a 6-nm InP etching stopper layer 1-6, and a 15-nm $In_{0.53}Ga_{0.47}As$ cap layer 1-7 doped with $1 \times 10^{19}$ cm$^{-3}$ of Si are formed in this order on an InP semiconductor substrate 1-0, thereby forming an epitaxial heterolayer structure EP.

To perform mesa etching, epitaxial layers except for a region where a desired heterojunction field effect transistor is to be formed are etched to the buffer layer 1-1 by a solution mixture of citric acid and hydrogen peroxide.

Subsequently, stacked metals AuGe/Ni are lifted off in the remaining source and drain regions where a heterojunction field effect transistor having the epitaxial multilayered structure EP is to be fabricated.

Thereafter, the resultant structure is annealed at 350° C. to electrically connect the stacked metals to a two-dimensional electron gas in the channel layer 1-2, thereby forming a source electrode 1-8 and a drain electrode 1-9.

Figure 2B:
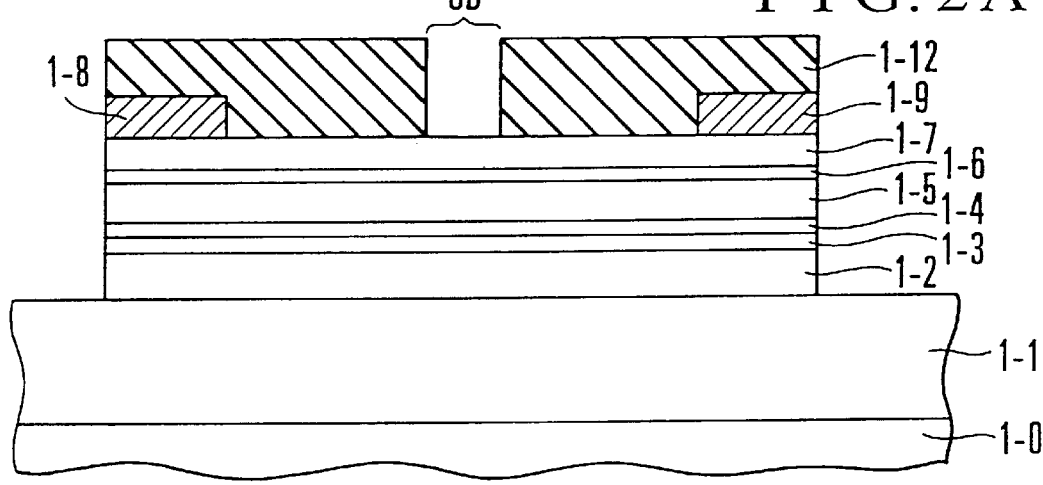

Next, the epitaxial multilayered structure EP is coated with a photoresist to form a dielectric film 1-12, and a gate recess OD is formed in a portion serving as a gate region by photo-lithography. This state is shown in FIG. 2B.

Figure 2C:
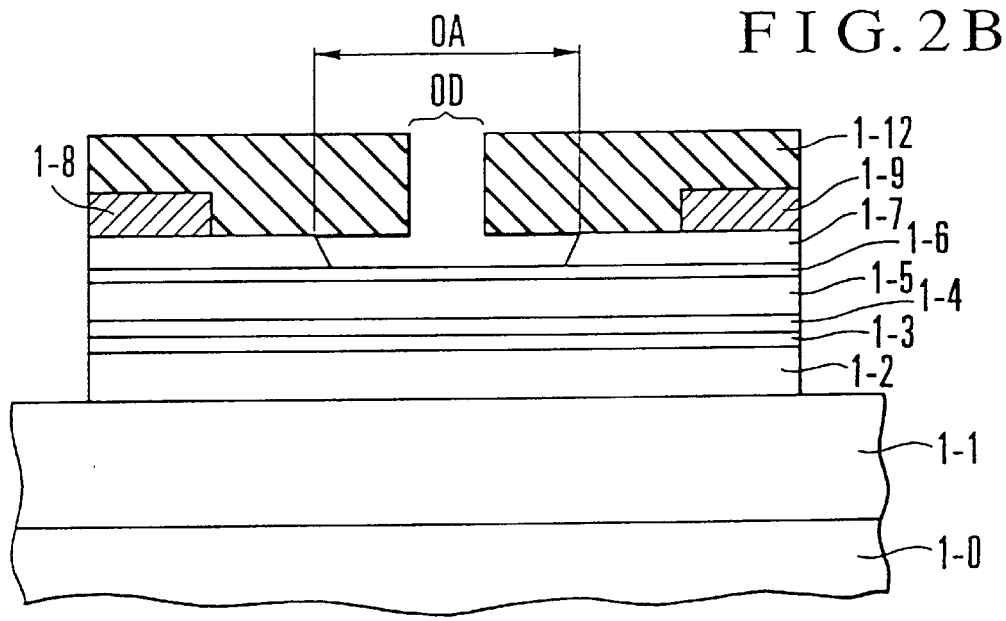

An etching solution is then injected from the gate recess OD to etch the cap layer 1-7 exposed to the bottom of the gate recess OD. Consequently, a portion of the cap layer 1-7 adjacent to the recess OD and below the dielectric film 1-12 is side-etched as shown in FIG. 2C. This side-etched region corresponds to the recess OA in FIG. 1 and is a hole having a relatively large area. This shape of this hole is not limited to a stripe or line shape. The etching solution herein used has a low etching rate for the etching stopper layer 1-6 and a high etching rate for the cap layer 1-7. For example, a solution mixture of citric acid and hydrogen peroxide is used. To form a large side-etched region (equivalent to gate region+separate region) to improve the breakdown voltpge of the heterojunction field effect transistor, the etching time is so set as to be much longer than the time within which the etching depth reaches the etching stopper layer 1-6.

Figure 2D:
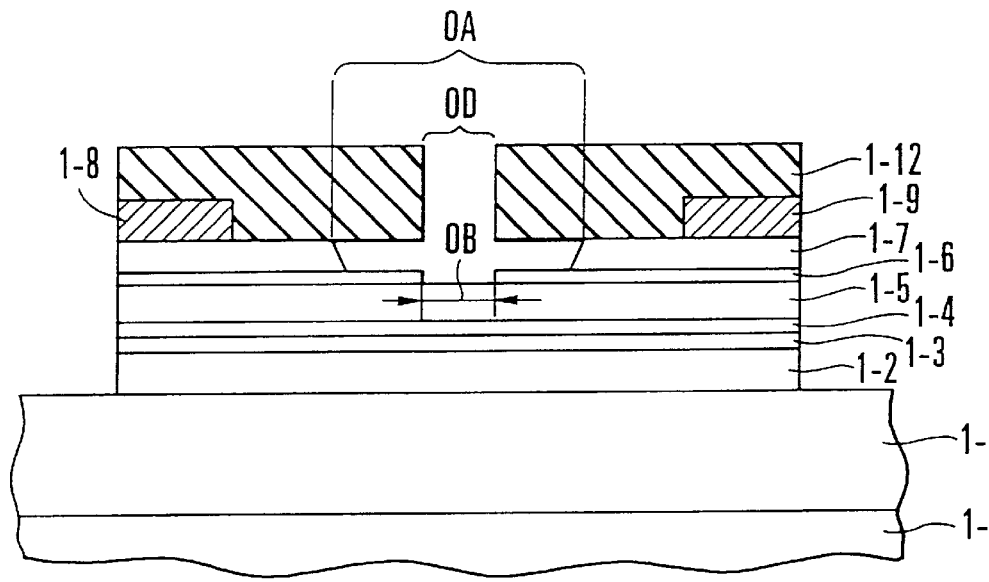

The wafer having the side-etched cap layer described above is placed in a vacuum chamber (not shown). Plasma etching is then performed in an inert gas (in this embodiment, Ar gas) atmosphere to remove only a portion of the etching stopper layer 1-6 immediately below the gate recess OD by using the gate recess OD as a mask as shown in FIG. 2D, thereby forming a recess OB (having a smaller area than the recess OA). For example, this plasma etching is done with an argon (Ar) gas pressure of 1 Pa and an RF power of 0.06 W/cm$^2$ for an etching time of 3 min. Note that the etching rate of the Schottky barrier layer 1-5 is much lower than that of the etching stopper layer 1-6. Therefore, only the etching stopper layer 1-6 is removed by using the difference between the sputtering rates of the etching stopper layer 1-6 and the Schottky barrier layer 1-5 with respect to Ar gas.

Figure 2E:
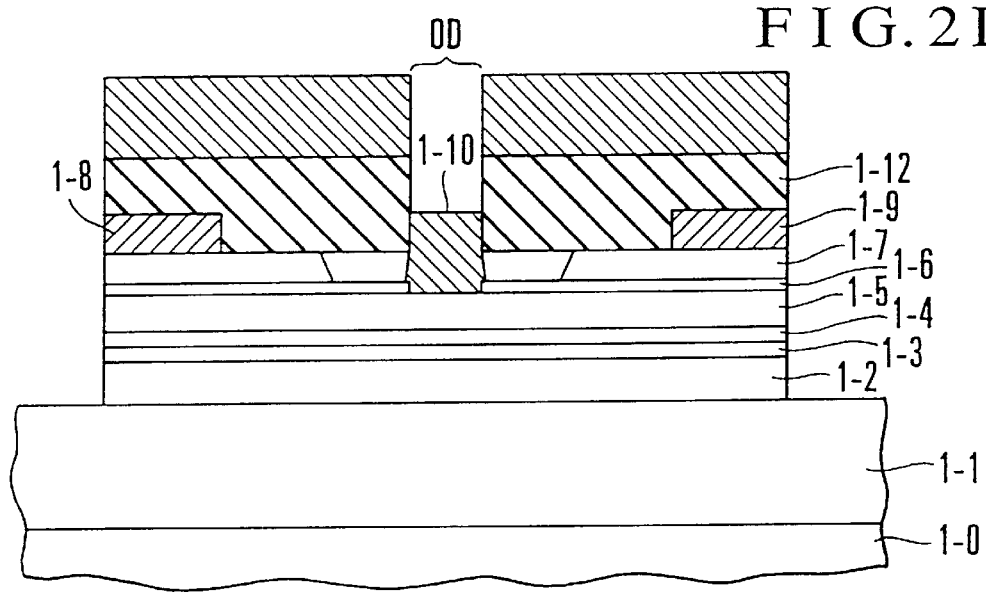

Subsequently, while the above vacuum state is held, Ti/Pt/Au metals are lifted off to form a gate electrode 1-10, as shown in FIG. 2E, on the surfaces of the Schottky barrier layer 1-5 and the etching stopper layer 1-6 adjacent to the Schottky barrier layer 1-5.

Figure 2F:
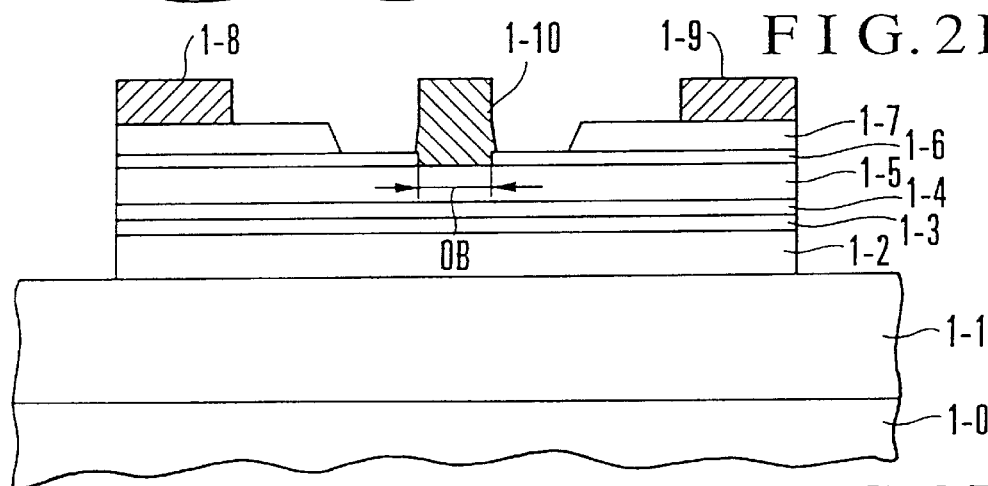

Finally, the stacked metals on the dielectric film 1-12 and the dielectric film 1-12 are removed to obtain a structure shown in FIG. 2F, completing the fabrication process.

Figure 3:
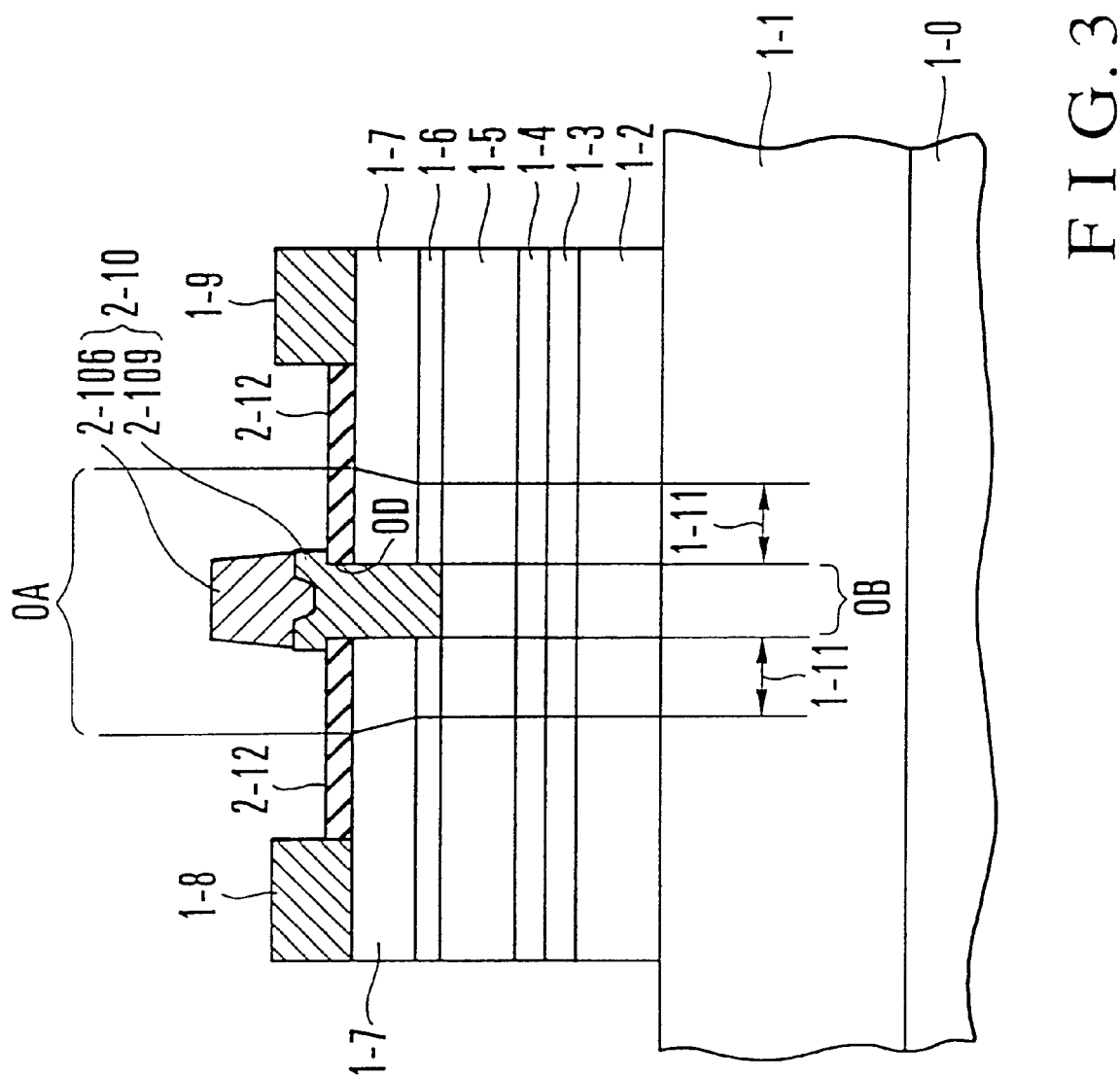
FIG. 3 is a sectional view showing another embodiment of the heterojunction field effect transistor according to the present invention.

FIG. 3 shows another embodiment of the present invention. In FIG. 3, the same reference numerals as in FIG. 1 denote the same parts.

Referring to FIG. 3, a 200-nm $In_{0.52}Al_{0.48}As$ buffer layer 1-1, a 15-nm $In_{0.53}Ga_{0.47}As$ channel layer 1-2, a 3-nm $In_{0.52}Al_{0.48}As$ spacer layer 1-3, an $In_{0.52}Al_{0.48}AS$ carrier supply layer 1-4 formed by an Si planner doping surface having a surface density of $5 \times 10^{12}$ cm$^{-2}$, a 10-nm $In_{0.52}Al_{0.48}As$ Schottky barrier layer 1-5, a 6-nm InP etching stopper layer 1-6, and a 15-nm $In_{0.53}Ga_{0.47}As$ cap layer 1-7 doped with $1 \times 10^{19}$ cm$^{-3}$ of Si as a dopant are formed in this order on an InP semiconductor substrate 1-0 by epitaxial growth (e.g., MOCVD or MBE), thereby forming a multilevel structure. This structure is the same as in FIG. 1. The threshold voltage of this multilevel structure is also the same as that of the structure shown in FIG. 1.

A source electrode 1-8 and a drain electrode 1-9 are also similarly formed. A gate electrode 2-10 is formed by a thin WSiN film 2-10a deposited on the surface of the Schottky barrier layer 1-5 and a Ti/Pt/Au metal layer 2-10b arranged on this thin WSiN film 2-10a. This gate electrode structure is formed as follows. That is, a thin dielectric film made from, e.g., SiN is deposited by photo-CVD, and a gate recess OD is formed. After a recess is formed by wet-chemical etching and dry etching, the thin WSiN film 2-10a is formed, and the Ti/Pt/Au metal layer 2-10b is deposited on it.

In this structure, as in the embodiment shown in FIGS. 1 to 2F, the Schottky barrier layer 1-5 in separate regions 1-11 is covered with the etching stopper layer 1-6. Therefore, a high two-dimensional electron gas density can be maintained in the channel layer 1-2 immediately below the separate regions 1-11, so deterioration of the characteristics caused by the parasitic resistance can be suppressed compared to the conventional structures. Also, etching in the direction of depth is prevented by the etching stopper layer 1-6. Accordingly, the side-etched regions (separate regions 1-11) of the cap layer 1-7 are extended by prolonging the wet-chemical etching time, and this improves the breakdown voltage.

A method of fabricating the heterojunction field effect transistor shown in FIG. 3 will be described in detail below with reference to FIGS. 4A to 4F.

Figure 4A:
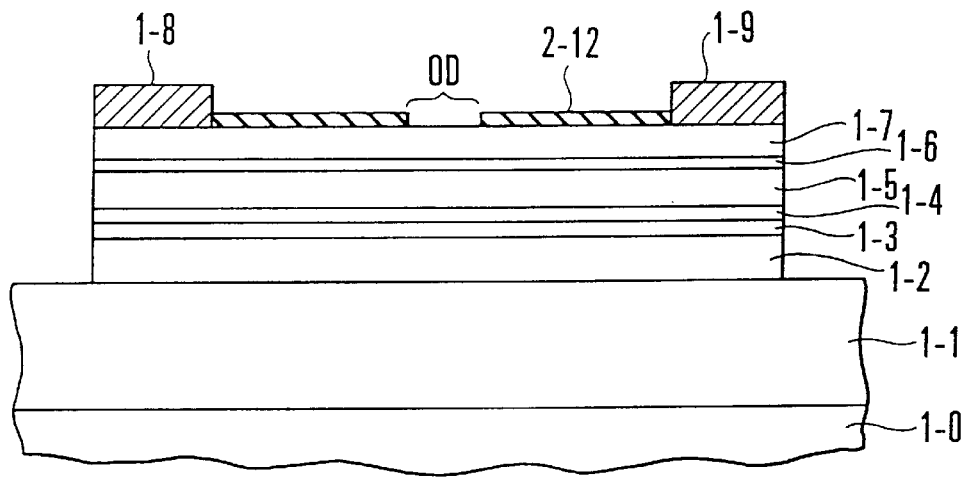
FIGS. 4A to 4F are sectional views showing a method of fabricating the heterojunction field effect transistor shown in FIG. 3.

Referring to FIG. 4A, a 200-nm $In_{0.52}Al_{0.48}As$ buffer layer 1-1, a 15-nm $In_{0.53}Ga_{0.47}As$ channel layer 1-2, a 3-nm $In_{0.52}Al_{0.48}As$ spacer layer 1-3, a 5-nm carrier supply layer 1-4, a 10-nm $In_{0.52}Al_{0.48}As$ Schottky barrier layer 1-5, a 6-nm InP etching stopper layer 1-6, and a 15-nm $In_{0.53}Ga_{0.47}As$ cap layer 1-7 doped with $1 \times 10^{19}$ cm$^{-3}$ of Si are formed in this order on an InP semiconductor substrate 1-0, thereby forming an epitaxial multilevel structure.

To perform mesa etching, epitaxial layers except for a region where a desired heterojunction field effect transistor is to be formed are etched to the buffer layer 1-1 by a solution mixture of citric acid and hydrogen peroxide.

Subsequently, stacked metals AuGe/Ni are lifted off in the remaining source and drain regions where a heterojunction field effect transistor having the epitaxial multilayered structure is to be fabricated.

Thereafter, the resultant structure is annealed at 350° C. to electrically connect the stacked metals to a two-dimensional electron gas in the channel layer 1-2, thereby forming a source electrode 1-8 and a drain electrode 1-9. The steps described up to this point are the same as in the embodiment shown in FIGS. 1 to 2F.

Next, a 100-nm SiN dielectric film 2-12 is deposited on the entire wafer surface by photo-CVD (Chemical Vapor Deposition). A pattern for forming a source electrode 1-8, a drain electrode 1-9, and a gate region is transferred by photo-lithography, and a recess OD is formed by reactive ion etching. This state is shown in FIG. 4A.

Figure 4B:
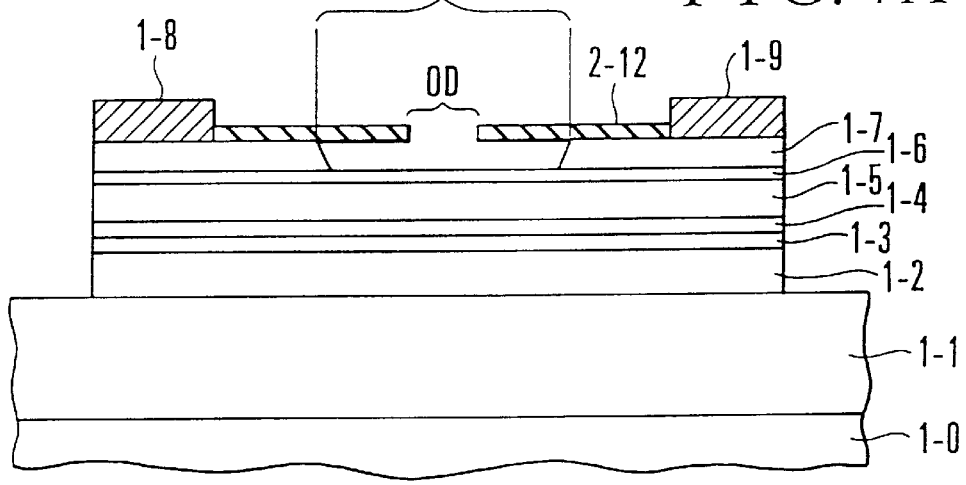

An etching solution is then injected from the gate recess OD for forming a gate region of the thin dielectric film 2-12 to etch the cap layer 1-7 exposed to the bottom of the gate recess OD. Consequently, a portion of the cap layer 1-7 adjacent to the recess OD and below the thin dielectric film 1-12 is side-etched as shown in FIG. 4B. This side-etched region corresponds to the recess OA in FIG. 1. The etching solution herein used has a low etching rate for the etching stopper layer 1-6 and a high etching rate for the cap layer 1-7. For example, a solution mixture of citric acid and hydrogen peroxide is used. To form a large side-etched region to improve the breakdown voltage of the heterojunction field effect transistor, the etching time is so set as to be much longer than the time within which the etching depth reaches the etching stopper layer 1-6.

Figure 4C:
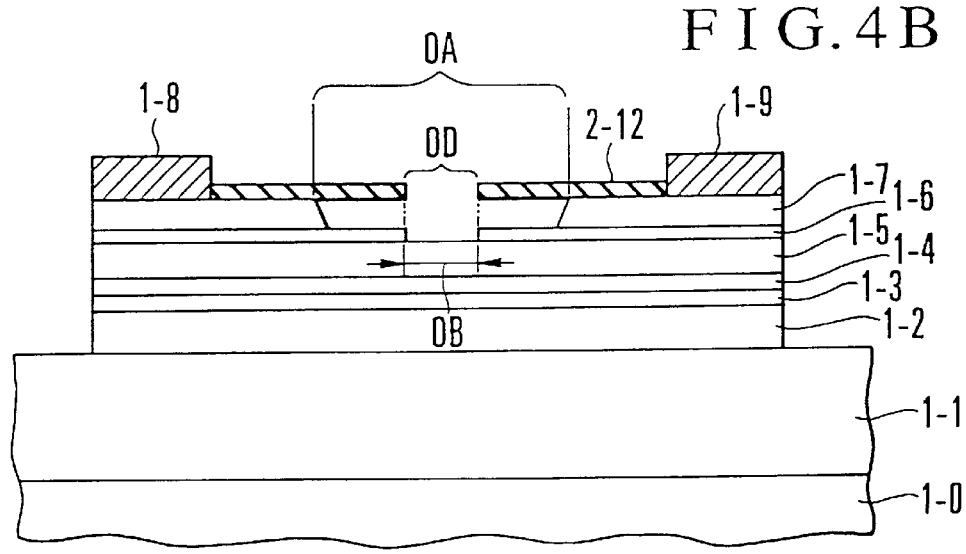

The wafer having the side-etched cap layer described above is placed in a vacuum chamber (not shown). Plasma etching is then performed in an inert gas (in this embodiment, Ar gas) atmosphere to remove only a portion of the etching stopper layer 1-6 immediately below /the gate recess OD by using the gate recess OD as a mask as shown in FIG. 4C, thereby forming a recess OB. For example, this plasma etching is done with an Ar gas pressure of 1 Pa and an RF power of 0.06 W/cm$^2$ for an etching time of 3 min. Note that the etching rate of the Schottky barrier layer 1-5 is much lower than that of the etching stopper layer 1-6. Therefore, only the etching stopper layer 1-6 is removed by using the difference between the sputtering rates of the etching stopper layer 1-6 and the Schottky barrier layer 1-5 with respect to Ar gas.

Figure 4D:
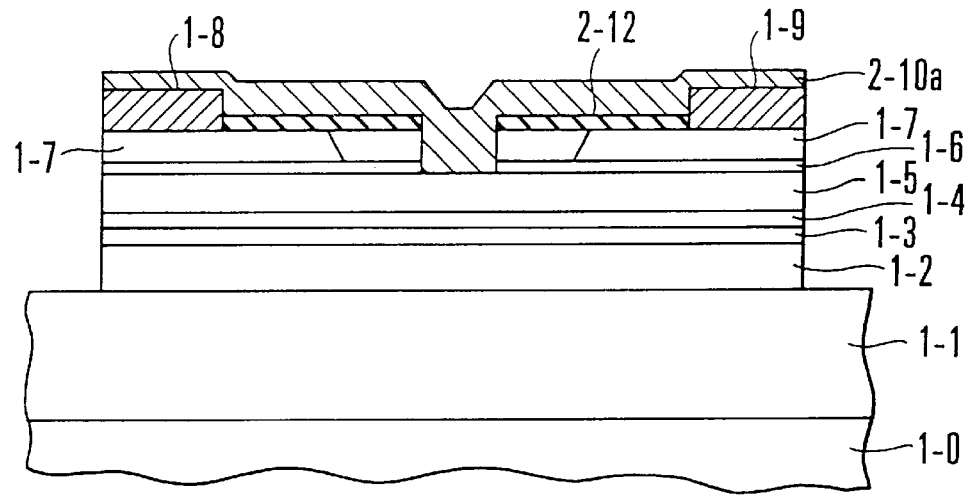

Subsequently, while the above vacuum state is held, a thin WSiN film 2-10a is deposited on the entire wafer surface by sputtering in an Ar: 90%, Nz: 10% atmosphere. This state is shown in FIG. 4D.

Figure 4E:
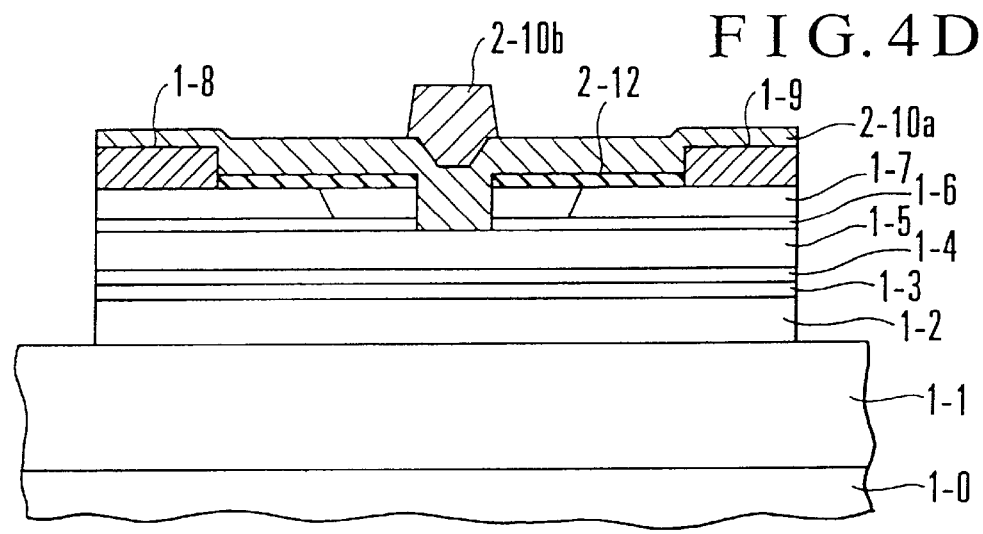
Figure 4F:
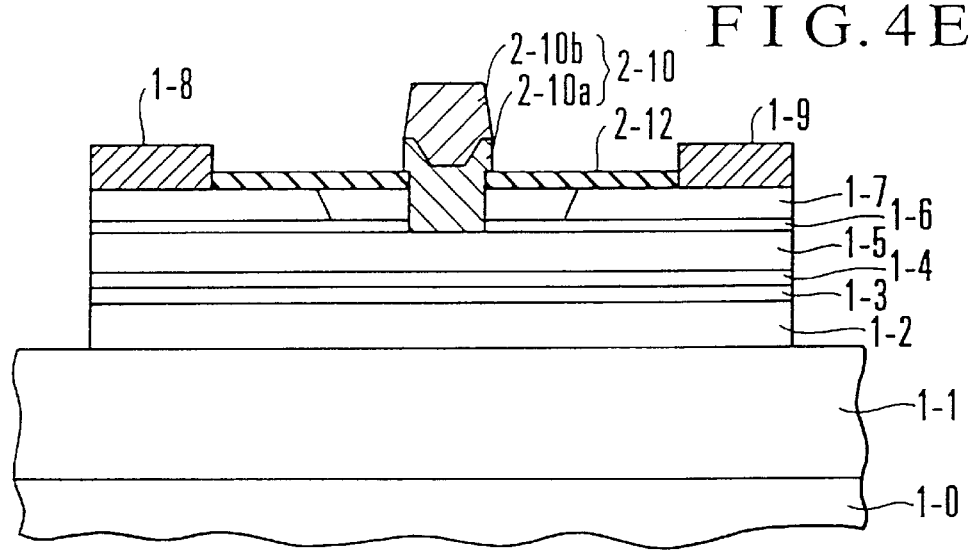

A gate electrode pattern is then formed by, e.g., photo-lithography, and a Ti/Pt/Au metal layer 2-10b is lifted off. This state is shown in FIG. 4E.

Finally, the thin WSiN film 2-10a is removed except for a portion of the gate electrode 2-10 (2-10a+2-10b), completing the fabrication process.

In the embodiment shown in FIGS. 3 and 4A to 4F, an enhancement mode heterojunction field effect transistor can be formed by changing the thicknesses of the Schottky barrier layer and the etching stopper layer. That is, by setting the thickness of the Schottky barrier layer 1-5 to 4 nm and the thickness of the etching stopper layer 1-6 to 7 nm, the threshold voltage becomes −0.5 V when epitaxial layers above the etching stopper layer 1-6 are removed and 0 V when epitaxial layers above the Schottky barrier layer 1-5 are removed. Since, however, the two-dimensional electron gas density in the side-etched region is lower than that of the embodiment shown in FIGS. 3 and 4A to 4F, the side-etched region cannot be made as large as in the embodiment shown in FIGS. 3 and 4A to 4F.

Figure 5:
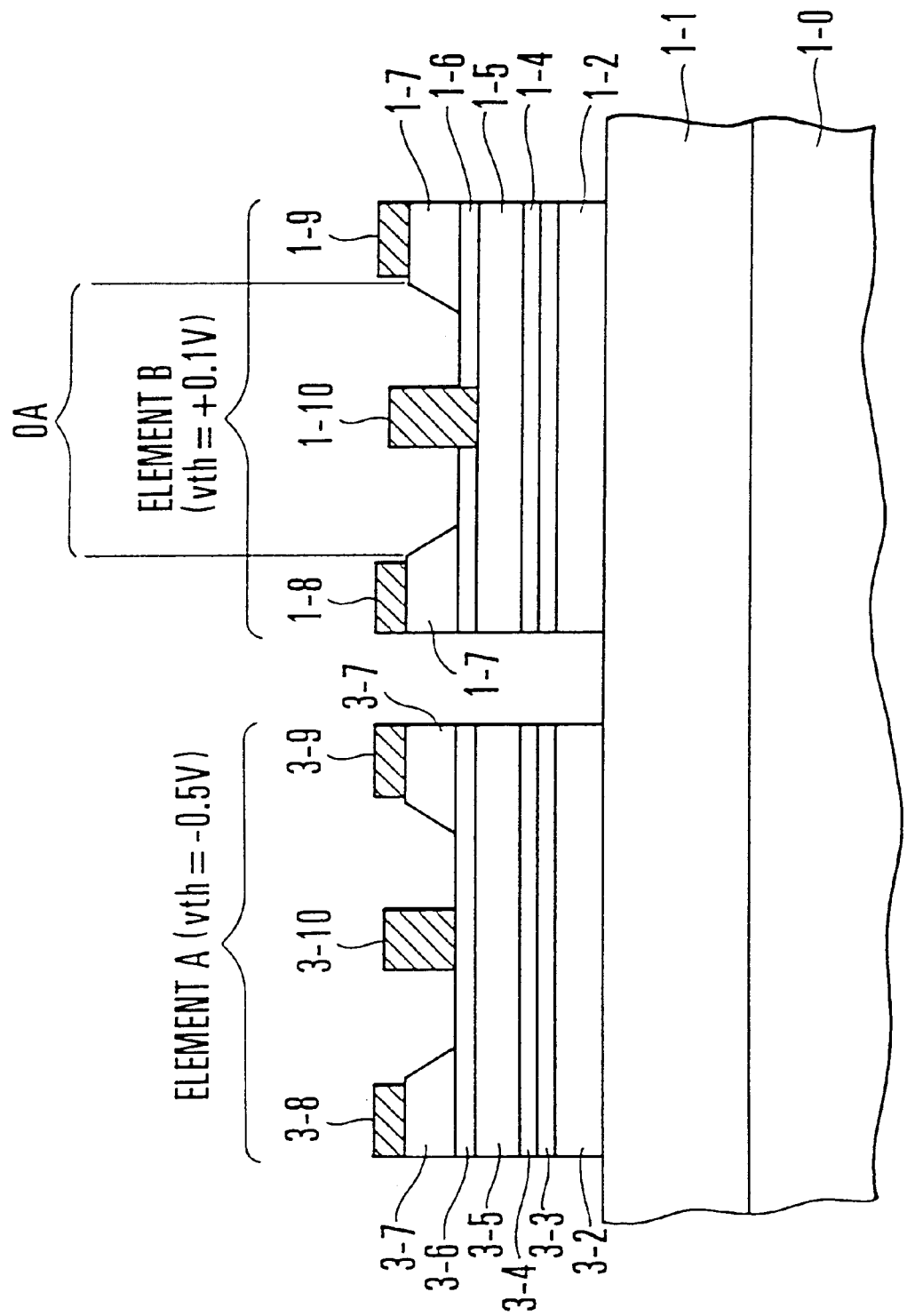
FIG. 5 is a sectional view showing still another embodiment of the heterojunction field effect transistor according to the present invention.
Figure 6:
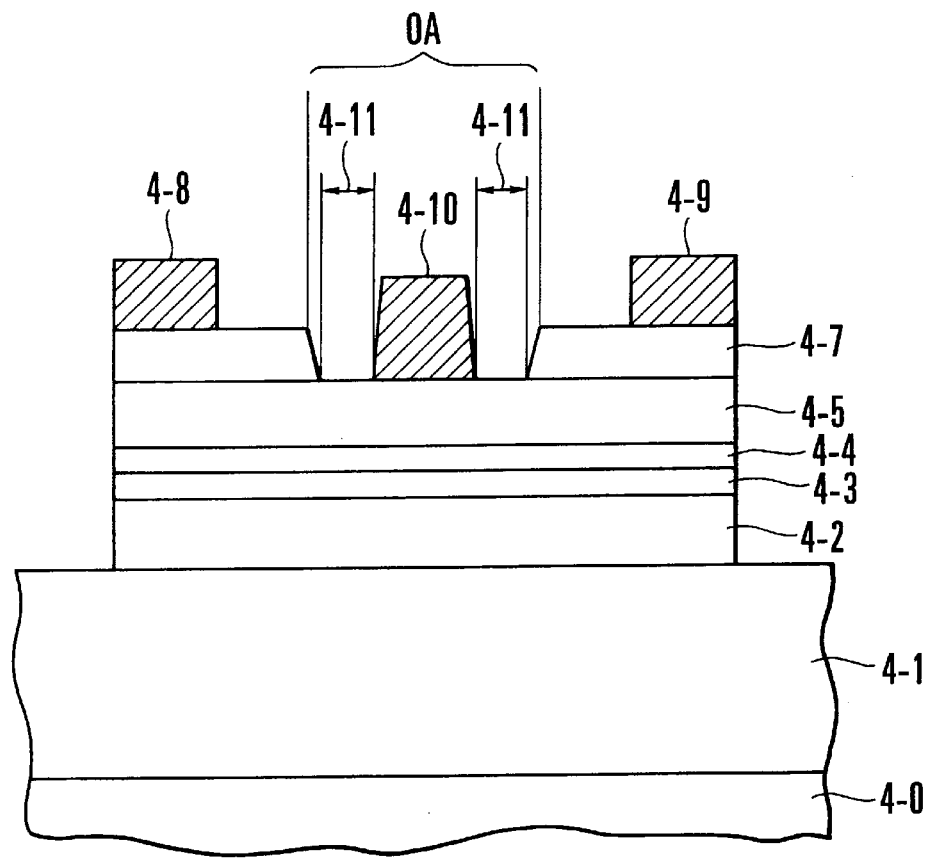
FIG. 6 is a sectional view showing one example of the conventional heterojunction field effect transistors.
Figures 7A, 7B:
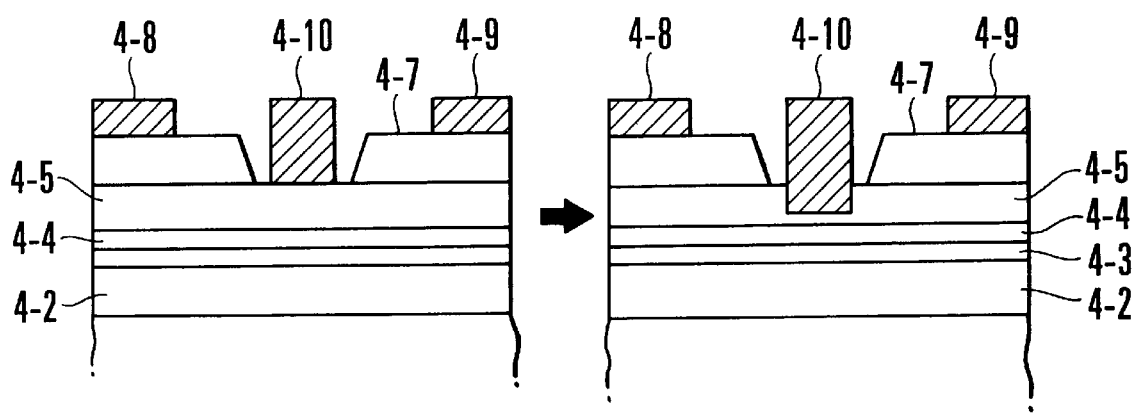
FIGS. 7A and 7B are sectional views showing another example of conventional heterojunction field effect transistors.

FIG. 5 shows still another embodiment of the heterojunction field effect transistor according to the present invention. In FIG. 5, the same reference numerals as in FIGS. 1 and 2A to 2F denote the same parts.

Referring to FIG. 5, a device B has the same device structure as shown in FIG. 1. That is, in a device A, a gate electrode 3-10 is formed on top of an etching stopper layer 3-6. In the device B, an etching stopper layer 1-6 is removed, and a gate electrode 1-10 is formed on top of a Schottky barrier layer 1-5. The device A is so designed that the threshold voltage is −0.5 V when a portion above the etching stopper layer 3-6 is removed. The device B is so designed that the threshold voltage is +0.1 V when a portion above the Schottky barrier layer 1-5 is removed.

The only difference between the structures of the devices A and B is whether the etching stopper layers 3-6 and 1-6 are present immediately below the gate electrodes 3-10 and 1-10, respectively. This difference in structure can be easily obtained by changing only the fabrication steps for the etching stopper layers. As a consequence, an enhancement mode field effect transistor and a depletion mode field effect transistor can be readily fabricated in the same epitaxial layers on the same substrate. In FIG. 5, reference numeral 3-2 denotes a channel layer; 3-3, a spacer layer; 3-4, a carrier supply layer; and 3-5, a Schottky barrier layer. These layers 3-2 to 3-5, the etching stopper layer 3-6, and a cap layer 3-7 have the same compositions as the device B on the right side.

As has been described above, the present invention can suppress an increase in the parasitic resistance in a channel layer immediately below a separate region between a source electrode and a drain electrode by forming an etching stopper layer so as to prevent a Schottky barrier layer from exposing around a gate electrode.

Additionally, the breakdown voltage of a heterojunction field effect transistor can be improved only by increasing the size of the separate region to improve the gate-drain breakdown voltage. Consequently, a heterojunction field effect transistor maintaining excellent device characteristics can be realized.

As described above, the present invention can achieve a high-threshold heterojunction field effect transistor and an enhancement mode heterojunction field effect transistor which cannot be given satisfactory characteristics and high uniformity by the conventional techniques. Accordingly, the degree of freedom of ultra-high-speed integrated circuit design can be expected to be increased.

What is claimed is:

1. A heterojunction field effect transistor comprising:
    a buffer layer arranged on a semiconductor substrate;
    a channel layer arranged on the buffer layer;
    a spacer layer arranged on the channel layer;
    a carrier supply layer arranged on the spacer layer;
    a Schottky barrier layer arranged on the carrier supply layer;
    an etching stopper layer arranged on the Schottky barrier layer;
    a cap layer arranged on the etching stopper layer and containing a high concentration dopant;
    a source electrode and drain electrode arranged apart from each other on the cap layer;
    a recess formed in a region of the cap layer sandwiched between the source and drain electrodes so as to extend from the cap layer to the Schottky barrier layer via the etching stopper layer;
    the Schottky barrier layer is covered with the etching stopper layer to both sides of the gate electrode; and
    the gate electrode is separated from the cap layer, the gate electrode being ledge-shaped such that the gate electrode is partly formed on a surface of said Schottky barrier layer exposed in the recess, and partly formed on the stopper layer exposed in the recess.

2. A transistor according to claim 1, wherein the recess comprises a first recess formed in said cap layer and a second recess formed in the etching stopper layer and having a smaller area than the area of the first recess.

3. A transistor according to claim 1, wherein the gate electrode protrudes upward from the first recess.

4. A transistor according to claim 3, wherein a surface of the cap layer and the recess in the region between the source electrode and the gate electrode and in the region between the drain electrode and the gate electrode are covered with a dielectric film.

5. A transistor according to claim 1, further comprising:
    a channel layer arranged on the buffer layer beside and spaced apart from the channel layer;
    a second spacer layer arranged on the spacer layer;
    a carrier supply layer arranged on the second spacer layer;
    a Schottky barrier layer arranged on the carrier supply layer;
    an etching stopper layer arranged on the Schottky barrier layer;
    a cap layer arranged on the etching stopper layer and containing a high concentration dopant;
    a source electrode and a drain electrode arranged apart from each other on the cap layer;
    a recess formed in the cap layer in a region sandwiched between the source and drain electrodes of the cap layer; and
    a gate electrode formed on a surface of the etching stopper layer exposed in the recess,
    wherein the gate electrode is separated from the cap layer.

6. A transistor according to claim 1, wherein the etching stopper layer is made from indium phosphide and the Schottky barrier layer is made from indium aluminium arsenide.

* * * * *